(12) United States Patent
Chang et al.

(10) Patent No.: US 12,396,113 B2
(45) Date of Patent: Aug. 19, 2025

(54) POWER SUPPLY DEVICE WITH ILLUMINATED HANDLE

(71) Applicant: DELTA ELECTRONICS, INC., Taoyuan (TW)

(72) Inventors: Kai-Lin Chang, Taoyuan (TW); Ching-Tang Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 196 days.

(21) Appl. No.: 18/373,282

(22) Filed: Sep. 27, 2023

(65) Prior Publication Data

US 2024/0414863 A1  Dec. 12, 2024

(30) Foreign Application Priority Data

Jun. 6, 2023  (CN) .......................... 202310664079.7

(51) Int. Cl.
*H05K 5/02* (2006.01)
*F21V 23/00* (2015.01)
(Continued)

(52) U.S. Cl.
CPC ........... *H05K 5/023* (2013.01); *F21V 23/005* (2013.01); *F21V 33/0096* (2013.01);
(Continued)

(58) Field of Classification Search
CPC .................................................... G06F 1/181
See application file for complete search history.

(56) References Cited

U.S. PATENT DOCUMENTS 9,660,369 B2   5/2017  Lee et al.
10,609,846 B1 * 3/2020  Lin ..................... H05K 7/20145
(Continued)

FOREIGN PATENT DOCUMENTS

CN   202603074 U   12/2012
CN   205544954 U    8/2016
(Continued)

OTHER PUBLICATIONS

Office Action dated Jan. 22, 2024 of the corresponding Taiwan patent application No. 112120978.
(Continued)

*Primary Examiner* — Jerry Wu
(74) *Attorney, Agent, or Firm* — Chun-Ming Shih; hdls ipr services

(57) ABSTRACT

A power supply device including a device body, a fan assembly, and a light source set and a handle. The device body includes a case and a control board, and the control board is disposed in the case. The fan assembly is disposed in the case. The light source set is disposed on the side of the fan assembly and includes a flexible printed circuit board and a wire. The wire is electrically connected to the flexible printed circuit board and connected to the control board. The handle is combined with the fan assembly, and at least a part of the flexible printed circuit board is disposed on an end surface of the handle facing the fan assembly. As a result, users may extract the power supply device under environments with insufficient light by exerting a force on the handle.

9 Claims, 6 Drawing Sheets

(51) Int. Cl.
*F21V 33/00* (2006.01)
*H05K 7/20* (2006.01)
*F21Y 115/10* (2016.01)

(52) U.S. Cl.
CPC ....... *H05K 5/0286* (2013.01); *H05K 7/20172* (2013.01); *F21Y 2115/10* (2016.08)

(56) References Cited

U.S. PATENT DOCUMENTS

2012/0194350 A1   8/2012  Crisp et al.
2018/0070473 A1*  3/2018  Zhang .................... G06F 1/181

FOREIGN PATENT DOCUMENTS

| | | |
|---|---|---|
| CN | 106771980 A | 5/2017 |
| CN | 212515613 U | 2/2021 |
| CN | 216133607 U | 3/2022 |
| TW | I606467 B | 11/2017 |
| TW | M577968 U | 5/2019 |

OTHER PUBLICATIONS

Search Report dated May 8, 2024 of the corresponding European patent application No. 23202177.4.

\* cited by examiner

POWER SUPPLY DEVICE WITH ILLUMINATED HANDLE

TECHNICAL FIELD

The technical field relates to a power supply device, and more particularly, to a power supply device with an illuminated handle.

DESCRIPTION OF RELATED ART

The Open Compute Project (OCP) organization provides the requirement for the Modular Hardware System-Common Redundant Power Supply (M-CRPS) with the usage of illuminated handles. The configuration involves disposing flexible circuit board on the rear side of the handle and connecting it to the rear control board for controlling and providing the power required for the operation of the illuminated handle.

However, the cost of flexible circuit board is higher, and when the flexible circuit board is connected to the rear control board, the flexible circuit board passes through the primary and secondary sides of transformers in the circuit, thereby the flexible circuit board requiring additional insulation components, such as double-layer high-temperature adhesive tape, to meet safety regulations. That results in further increased overall costs.

In view of the above drawbacks, the inventor proposes this disclosure based on his expert knowledge and elaborate researches in order to solve the problems of related art.

SUMMARY OF THE DISCLOSURE

This disclosure is a power supply device with an illuminated handle, which the fan assembly is combined with the light source set and the handle, and users may exert a force on the handle under environments with insufficient light to extract the power supply device.

This disclosure is a power supply device with an illuminated handle including a device body, a fan assembly, a light source set, and a handle. The device body includes a case and a control board. The control board is disposed in the case. The fan assembly is disposed in the case. The light source set is disposed on a side of the fan assembly and includes a flexible printed circuit board and a wire. The wire is electrically connected to the flexible printed circuit board and connected to the control board. The handle is combined with the fan assembly, wherein at least a part of the flexible printed circuit board is disposed on an end surface of the handle facing the fan assembly.

In comparison with the related art, the power supply device with an illuminated handle of this disclosure is to combine the light source set and the handle with the fan assembly. The light source set includes a flexible printed circuit board and a wire. The wire is electrically connected to the flexible printed circuit board and connected to the control board located on the rear side of the case. As a result, the length of the flexible printed circuit board is shortened, and the objective of reducing costs and complying with safety regulations are achieved.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
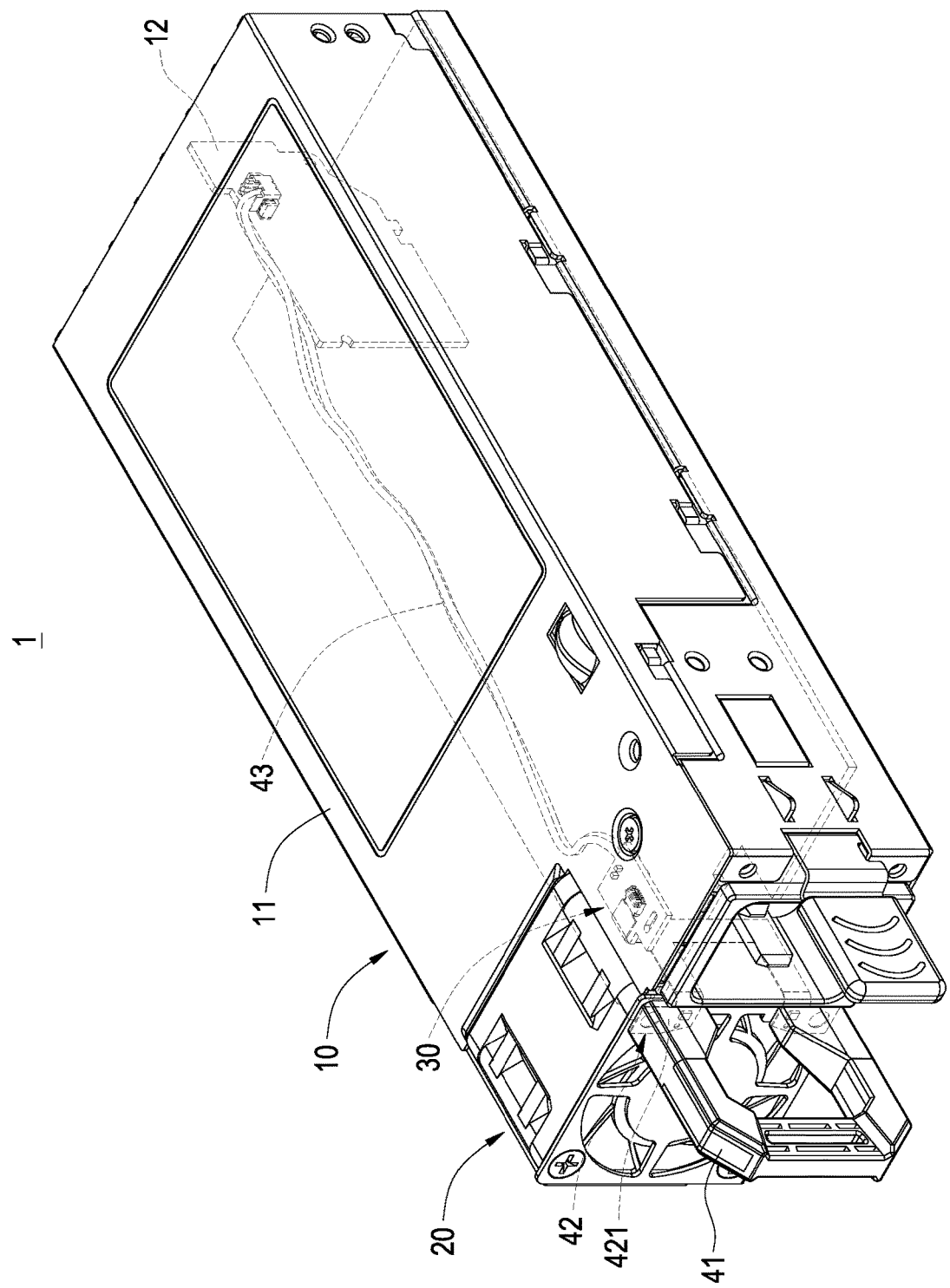
FIG. 1 is a perspective schematic view of the power supply device with an illuminated handle in this disclosure.
Figure 2:
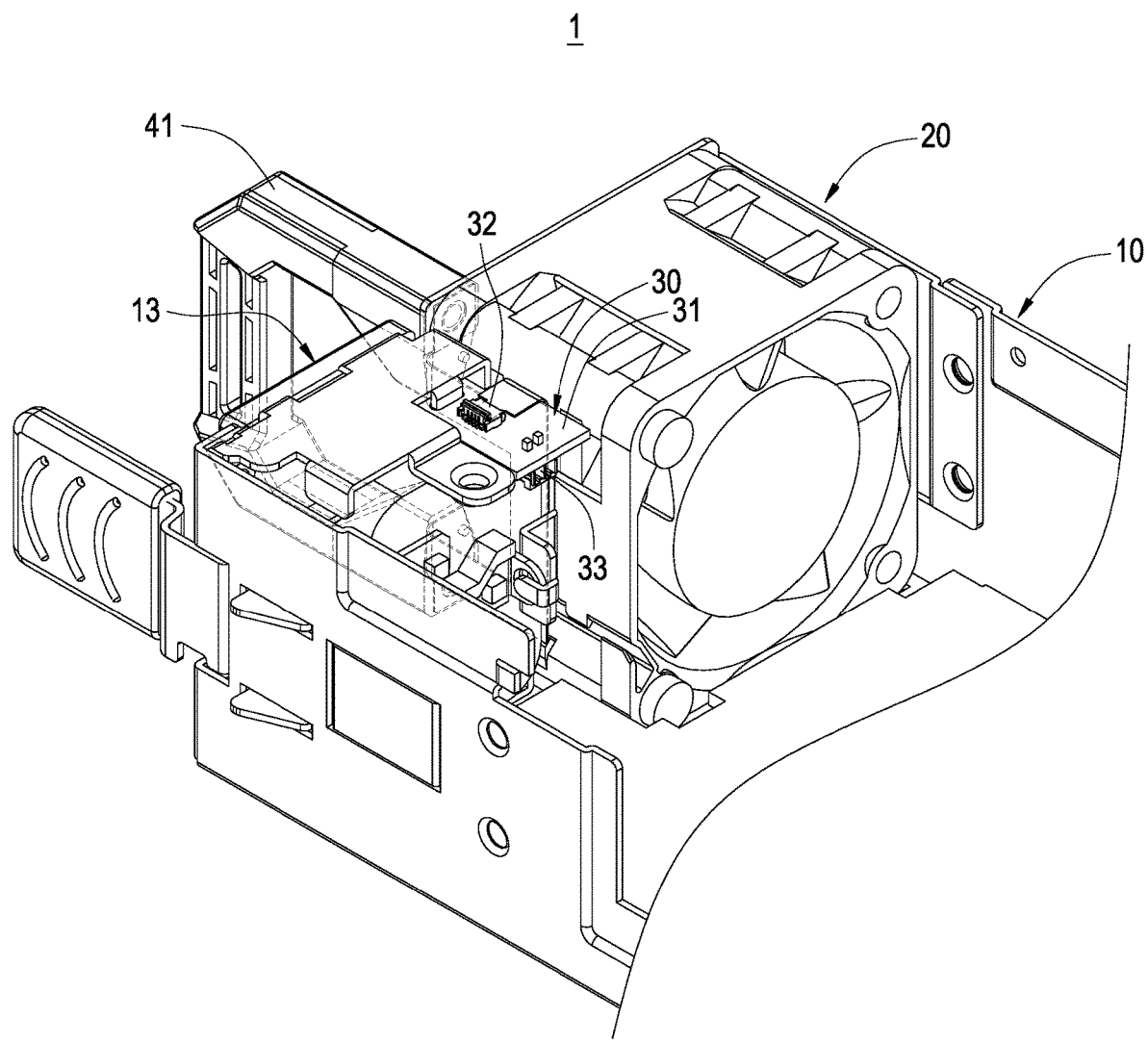
FIG. 2 is a partial perspective exploded schematic view of another side of the power supply device with an illuminated handle in this disclosure.

Please refer to FIG. 1 and FIG. 2, which is a perspective schematic view of the power supply device with an illuminated handle in this disclosure and a partial perspective exploded schematic view of another side of the power supply device with an illuminated handle in this disclosure. This disclosure is a power supply device 1 with an illuminated handle 41 including a device body 10, a fan assembly 20 and a light source set 42. The device body 10 includes a case 11 and a control board 12, and the control board 12 is disposed in the case 11. The fan assembly 20 is disposed in the case 11. Furthermore, the light source set 42 is disposed on one side of the fan assembly 20. The light source set 42 includes a flexible printed circuit board 421 and a wire 43. The wire 43 is electrically connected to the flexible printed circuit board 421 and connected to the control board 12.

It is worth noticing the control board 12 serves as the system controller within the power supply device 1. That is, the control board 12 controls the central controller or specific circuits of the entire server system. Through the light source set 42 being electrically connected to the control board 12, the system controller or specific circuits within the power supply device 1 may control the operation of the light source set 42.

In this embodiment, the power supply device 1 further includes an adapter board 30 disposed on one side of the light source set 42. The arrangement of the adapter board 30 is described below.

Specifically, the adapter board 30 includes a light conduction portion 32 and a wire connection portion 33. The wire 43 is electrically connected to the wire connection portion 33 and further connected to the control board 12. Moreover, the flexible printed circuit board 421 is electrically connected to the light conduction portion 32.

Figure 3:
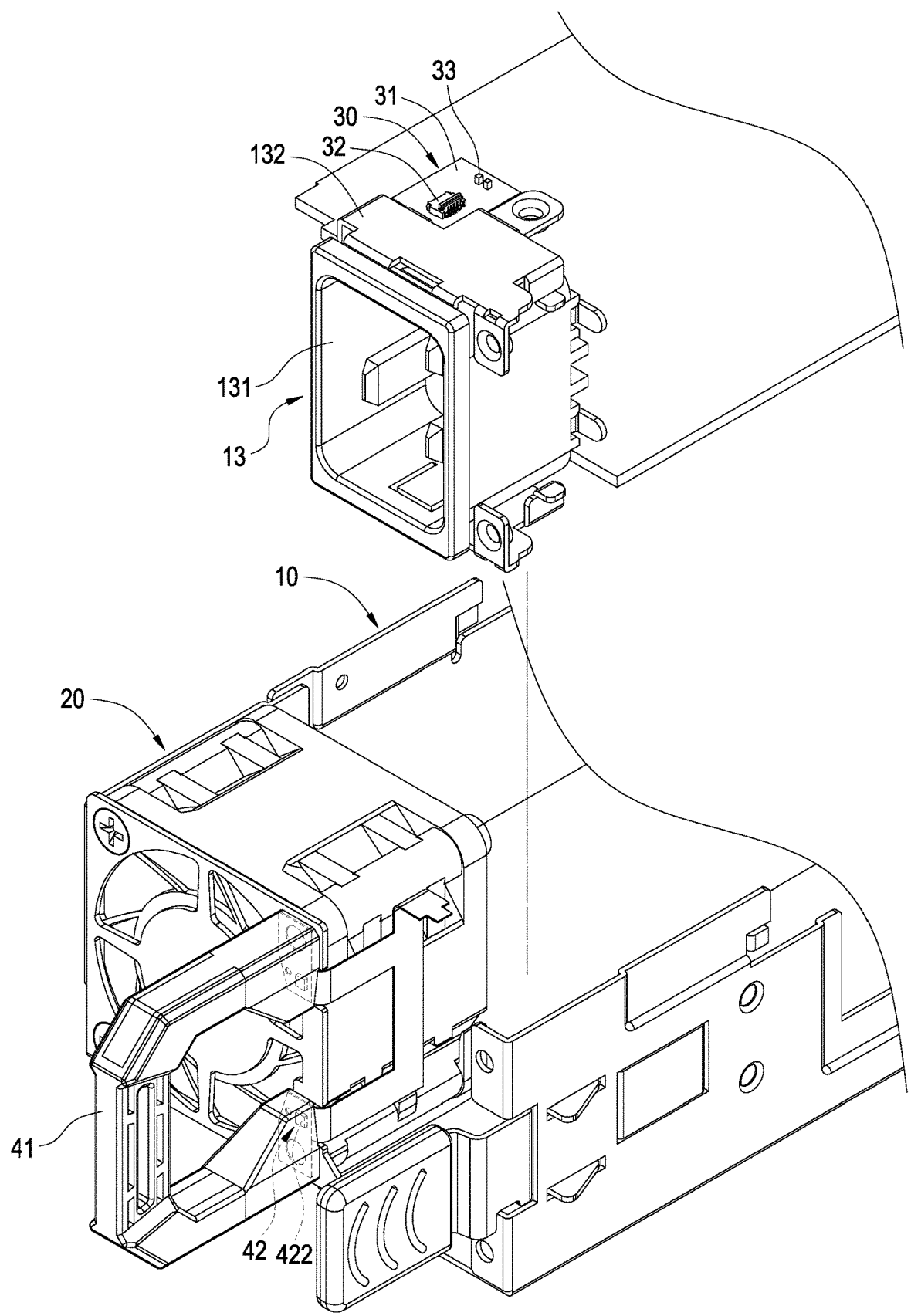
FIG. 3 is a perspective schematic view of the separation of the power socket set from the power supply device in this disclosure.
Figure 4:
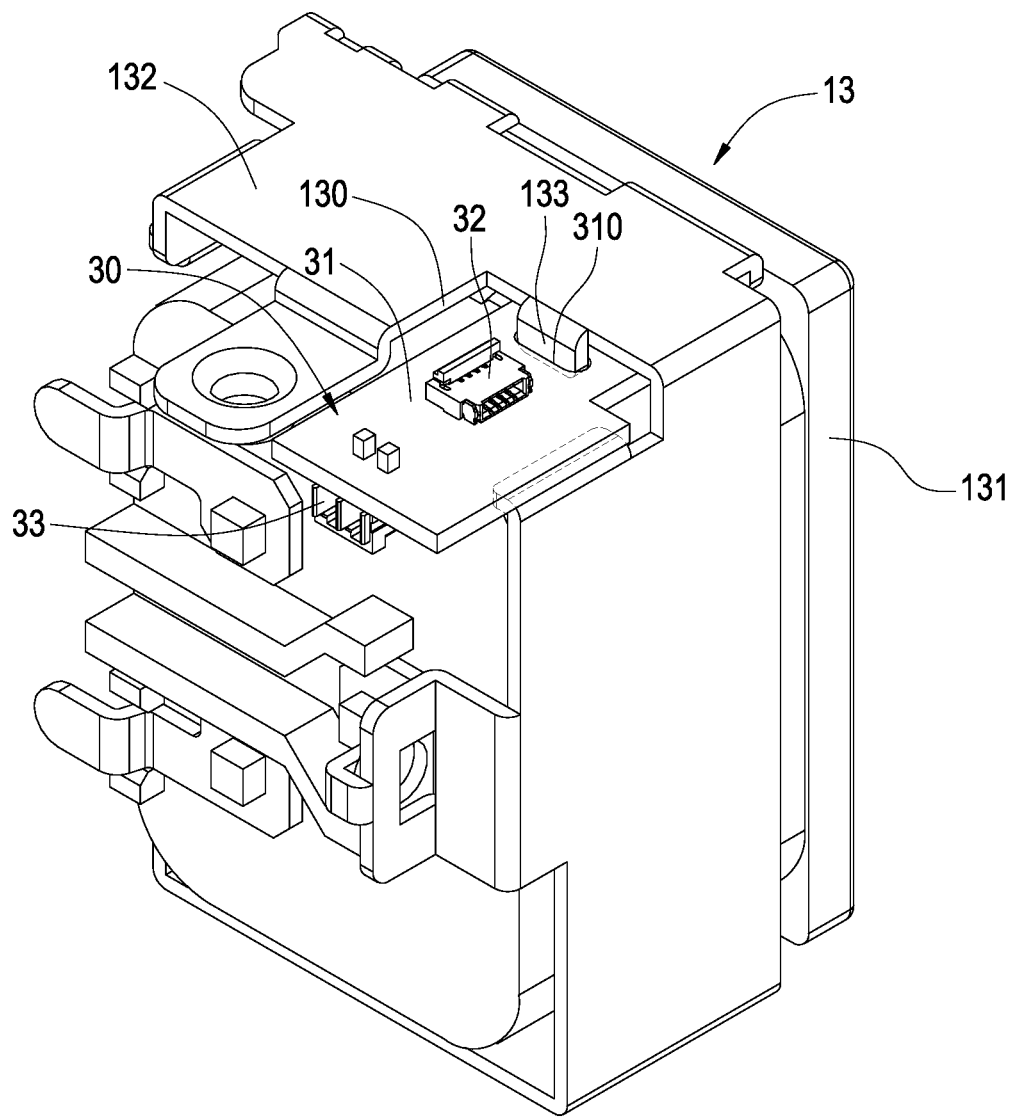
FIG. 4 is a perspective schematic view of the power socket set in this disclosure.
Figure 5:
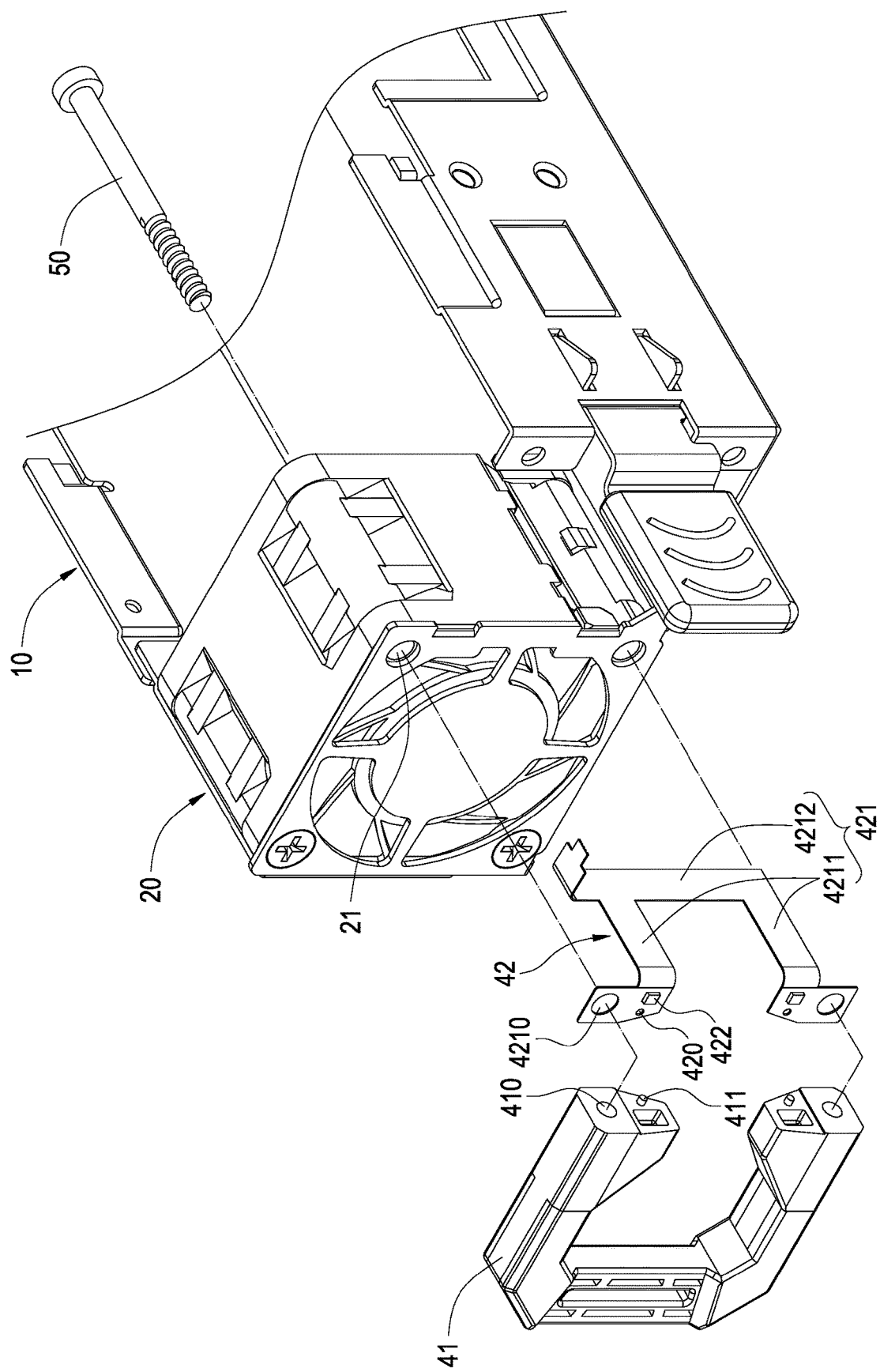
FIG. 5 is a perspective exploded schematic view of the illuminated handle in this disclosure.

Please refer to FIG. 3 to FIG. 5, which are a perspective schematic view of the separation of the power socket set from the power supply device in this disclosure, a perspective schematic view of the power socket set in this disclosure, and a perspective exploded schematic view of the illuminated handle in this disclosure. In this embodiment, the light conduction portion 32 of the adapter board 30 includes a flexible printed cable (FPC) connector. Additionally, the wire connection portion 33 includes a wire connector or a golden finger connection pad.

It should be noted that the arrangement of the light conduction portion 32 and the wire connection portion 33 only needs to achieve the purpose of electrical connection and is not limited to the above embodiments. Moreover, the wire connection portion 33 may include a surface-mounted electronic component or a plug-in electronic component according to requirements of use. In the embodiment of this disclosure, the wire connection portion 33 includes a dip connector.

Moreover, the power supply device 1 further includes a handle 41 combined with the fan assembly 20. Additionally, at least a part of the flexible printed circuit board 421 is arranged on the end surface of the handle 41 facing the fan assembly 20. In this embodiment, the handle 41 is combined on an outer surface of the fan assembly 20 away from the case 11, and the handle 41 may be made of transparent plastic. The light emitted from the light source set 42 may penetrate into the handle 41 to make the handle 41 form a luminous handle. Therefore, users may identify the position of the handle 41 under the environments with insufficient lighting to facilitate user exerting a force on the handle 41 to extract the power supply device 1.

In one embodiment of this disclosure, the power supply device 1 further includes a power socket set 13 combined on one side of the fan assembly 20. The power socket set 13 includes a socket body 131, and the socket body 131 includes a socket bracket 132. The socket bracket 132 may made of metal and includes a pin 133 being bended and extended.

In this embodiment, the adapter board 30 is arranged on the socket body 131. Specifically, the adapter board 30 is disposed on the socket bracket 132 of the socket body 131. In more detail, a slot 310 is disposed on the circuit board 31 of the adapter board 30. The adapter board 30 is positioned on the socket body 131 through the pin 133 being inserted in the slot 310. The adapter board 30 is positioned on the socket body 131 through the pin 133 being inserted in the slot 310.

In one embodiment of this disclosure, the handle 41 is a U-shaped handle, and the two ends of the handle 41 are fixed on one side of the fan assembly 20 adjacent to the power socket set 13.

It is worth noticing that the socket bracket 132 is formed with a limiting slot 130 at the location of the pin 133. Furthermore, the adapter board 30 is placed within the limiting slot 130. Accordingly, the outer edge of the adapter board 30 is restricted by the limiting slot 130 and may not be moved.

It should be noted that the socket bracket 132 is mainly used to fix the socket body 131 in the case 11. Thus, the socket body 131 may be more stable when the power cord being plugged or unplugged.

In this embodiment, the handle 41 includes a protrusion 411 disposed on the end surface of the handle 41 facing the fan assembly 20. Additionally, a positioning hole 420 is disposed on the flexible printed circuit board 421 correspondingly. The flexible printed circuit board 421 is positioned on the end surface of the handle 41 through the protrusion 411 being inserted in the positioning hole 420.

In more detail, the light source set 42 includes at least one light source 422 disposed on the flexible printed circuit board 421. In some embodiments, the light source 422 includes, but not limited, an LED. Moreover, the flexible printed circuit board 421 includes at least one conducting section 4211 and a connecting section 4212 connecting to the conducting section 4211. The conducting section 4211 is combined with a light source 422 and positioned on the end surface of the handle 41. The connecting section 4212 is connected to the light conduction portion 32 of the adapter board 30.

Accordingly, the light source 422 is connected to the adapter board 30 through the flexible printed circuit board 421 and the light conduction portion 32, and is further connected to a wire 43 through the adapter board 30 and the wire connection portion 33 and then is connected to the control board 12 located at the rear side through the wire 43. As a result, the control board 12 may control the light source 422.

As shown in FIG. 5, the power supply device 1 further includes a plurality of fasteners 50. Moreover, the fan assembly 20 includes a plurality of through holes 21 for insertions of the fasteners 50. A perforation 4210 is disposed on the flexible printed circuit board 421, and two screw holes 410 are disposed on two end surface of the handle 41 separately. Each fastener 50 passes through the through hole 21, the perforation 4210 and the screw hole 410 sequentially to fix the handle 41.

Figure 6:
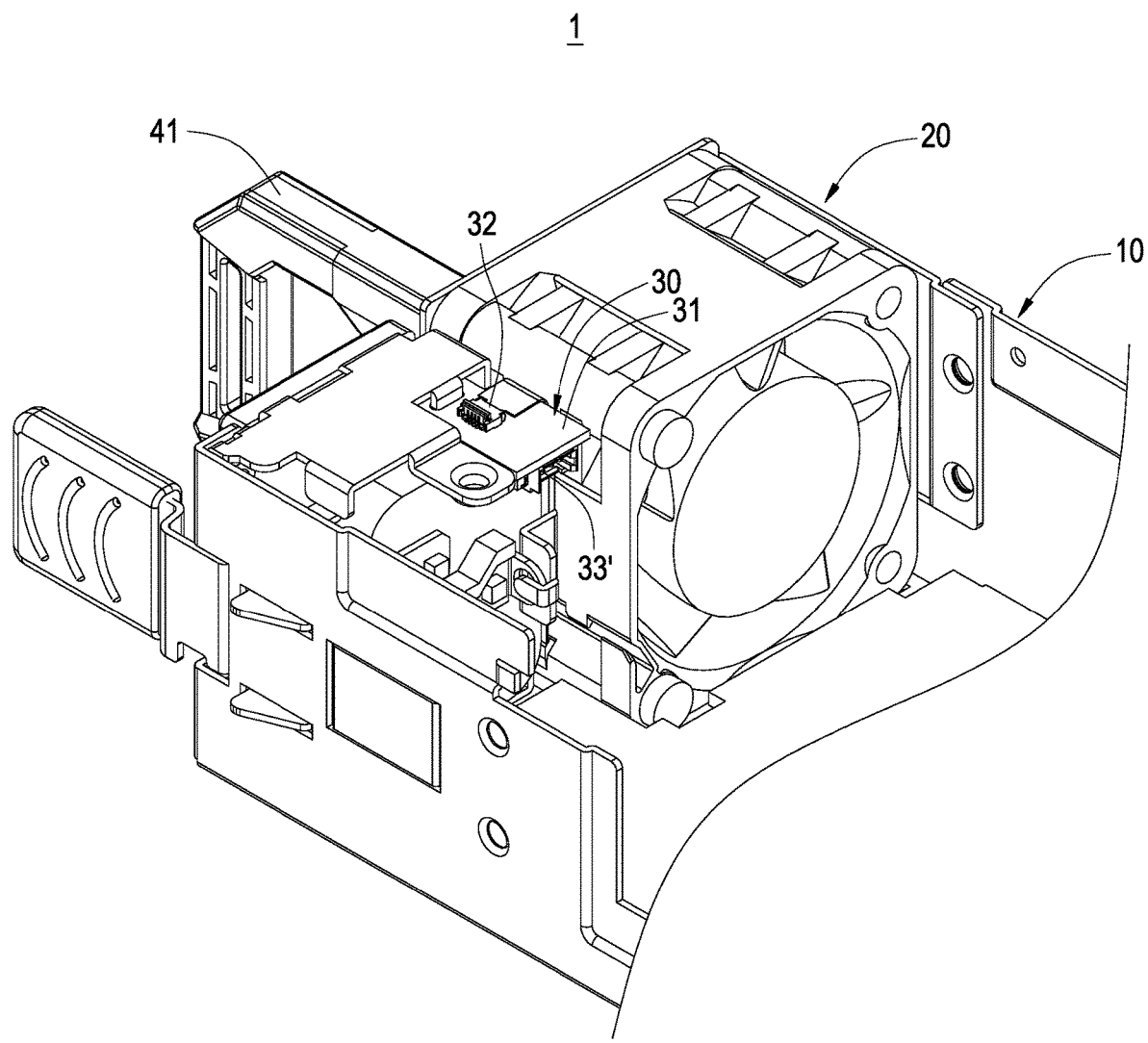
FIG. 6 is another embodiment of the adapter board in this disclosure.

Please refer to FIG. 6, which is another embodiment of the adapter board in this disclosure. This embodiment is similar to the previous embodiment. The adapter board 30 includes a circuit board 31, a light conduction portion 32 electrically connected to the circuit board 31, and a wire connection portion 33'. The difference of this embodiment is that the arrangement of the wire connection portion 33'. In this embodiment, the wire connection portion 33' is a surface mount electronic component.

While this disclosure has been described by means of specific embodiments, numerous modifications and variations could be made thereto by those skilled in the art without departing from the scope and spirit of this disclosure set forth in the claims.

What is claimed is:

1. A power supply device with an illuminated handle, comprising: a device body, comprising a case and a control board disposed in the case; a fan assembly, disposed in the case; a light source set, disposed on an end surface of the fan assembly, comprising a flexible printed circuit board and a wire, the wire electrically connected to the flexible printed circuit board and connected to the control board; and a handle, combined with the fan assembly, wherein at least a part of the flexible printed circuit board is disposed on an end surface of the handle facing the fan assembly; and a plurality of fasteners, wherein the fan assembly comprises a plurality of through holes inserted by the plurality of fasteners, a perforation is defined on the flexible printed circuit board and two screw holes are respectively defined on two end surfaces of the handle, the handle is fixed through each fastener passing through each through hole, the perforation and one of the screw holes sequentially and illuminated by a light source.

2. The power supply device with an illuminated handle according to claim 1, further comprising an adapter board arranged on a side of the light source set.

3. The power supply device with an illuminated handle according to claim 2, further comprising a power socket set combined on a side of the fan assembly, wherein the power socket set comprises a socket body, and the adapter board is arranged on the socket body.

4. The power supply device with an illuminated handle according to claim 3, wherein the socket body comprises a socket bracket, and the adapter board is disposed on the socket bracket.

5. The power supply device with an illuminated handle according to claim 4, wherein the socket bracket comprises a pin extended curvedly, a slot is defined on the adapter board, and the adapter board is positioned on the socket body through the pin being inserted in the slot.

6. The power supply device with an illuminated handle according to claim 2, wherein the adapter board comprises a wire connection portion, and the wire is electrically connected to the wire connection portion.

7. The power supply device with an illuminated handle according to claim 2, wherein the adapter board comprises a light conduction portion, and the flexible printed circuit board is electrically connected to the light conduction portion.

8. The power supply device with an illuminated handle according to claim 1, wherein the handle comprises a protrusion disposed on the end surface thereof facing the fan assembly, a positioning hole is correspondingly defined on the flexible printed circuit board, and the flexible printed circuit board is positioned on the end surface of the handle through the protrusion being inserted in the positioning hole.

9. The power supply device with an illuminated handle according to claim 8, wherein the light source set comprises at least one light source disposed on the flexible printed circuit board, the flexible printed circuit board comprises at least one conducting section and a connecting section connected to the at least one conducting section, and the at least one conducting section is combined with the at least one light source and positioned on the end surface of the handle.

\* \* \* \* \*